(12) United States Patent
Zhao

(10) Patent No.: US 11,974,458 B2
(45) Date of Patent: Apr. 30, 2024

(54) OLED DISPLAY PANEL AND OLED DISPLAY DEVICE

(71) Applicants: WUHAN CHINA STAR OPTOELECTRONICS TECHNOLOGY CO., LTD., Hubei (CN); WUHAN CHINA STAR OPTOELECTRONICS SEMICONDUCTOR DISPLAY TECHNOLOGY CO., LTD., Hubei (CN)

(72) Inventor: Yuanyuan Zhao, Hubei (CN)

(73) Assignees: WUHAN CHINA STAR OPTOELECTRONICS TECHNOLOGY CO., LTD., Hubei (CN); WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 414 days.

(21) Appl. No.: 17/298,634

(22) PCT Filed: Apr. 30, 2021

(86) PCT No.: PCT/CN2021/091515
§ 371 (c)(1),
(2) Date: May 31, 2021

(87) PCT Pub. No.: WO2022/222182
PCT Pub. Date: Oct. 27, 2022

(65) Prior Publication Data
US 2022/0393140 A1    Dec. 8, 2022

(30) Foreign Application Priority Data

Apr. 21, 2021 (CN) .......................... 202110430590.1

(51) Int. Cl.
*H10K 50/858* (2023.01)
*H10K 50/844* (2023.01)
(Continued)

(52) U.S. Cl.
CPC ......... *H10K 50/858* (2023.02); *H10K 50/844* (2023.02); *H10K 59/12* (2023.02); *H10K 2102/351* (2023.02)

(58) Field of Classification Search
CPC .... H10K 50/858; H10K 50/844; H10K 59/12; H10K 2102/351; H10K 59/65; H10K 50/8426
See application file for complete search history.

(56) References Cited

U.S. PATENT DOCUMENTS

2007/0216289 A1*  9/2007  Kuma ................. H10K 50/852
                                                         313/504
2020/0117047 A1  4/2020  Yuan
(Continued)

FOREIGN PATENT DOCUMENTS

CN      104485429 A      4/2015
CN      106981504 A      7/2017
(Continued)

*Primary Examiner* — Yasser A Abdelaziez
(74) *Attorney, Agent, or Firm* — Rivka Friedman

(57) ABSTRACT

An organic light-emitting diode (OLED) display panel and an OLED display device are provided. In a second display area of the OLED display panel, a light transmission enhancement layer is disposed on a side of a light-emitting layer away from a driving circuit layer. By disposing the light transmission enhancement layer on the light-emitting layer, a resonant microcavity of the OLED display panel can be changed by the light transmission enhancement layer. Therefore, light transmittance of the OLED display panel is increased, thereby improving an imaging effect of an under-screen camera.

20 Claims, 7 Drawing Sheets

(51) Int. Cl.
*H10K 59/12* (2023.01)
*H10K 102/00* (2023.01)

(56) References Cited

U.S. PATENT DOCUMENTS

| | | | |
|---|---|---|---|
| 2020/0288070 A1 | 9/2020 | Siala et al. | |
| 2021/0013265 A1 | 1/2021 | Hinata et al. | |
| 2021/0202635 A1* | 7/2021 | Wang | H10K 59/65 |
| 2022/0158137 A1* | 5/2022 | Chen | G06F 1/1626 |

FOREIGN PATENT DOCUMENTS

| | | |
|---|---|---|
| CN | 109599416 A | 4/2019 |
| CN | 110148612 A | 8/2019 |
| CN | 110213471 A | 9/2019 |
| CN | 110828699 A | 2/2020 |
| CN | 111106155 A | 5/2020 |
| CN | 112420959 A | 2/2021 |
| CN | 112436098 A | 3/2021 |
| CN | 112582570 A | 3/2021 |
| JP | 2012018868 A | 1/2012 |

* cited by examiner

OLED DISPLAY PANEL AND OLED DISPLAY DEVICE

FIELD

The present disclosure relates to the field of display technologies, and more particularly, to an organic light-emitting diode (OLED) display panel and an OLED display device.

BACKGROUND

Organic light-emitting diode (OLED) display devices are widely used because they have advantages of self-luminescence, fast response speed, wide viewing angles, and flexibility. A camera-under-panel (CUP) design is applied to conventional OLED display devices to increase a screen-to-body ratio. However, an OLED display panel has a great number of layers, leading to poor light transmittance of the OLED display panel. Therefore, light input into an under-screen camera is insufficient, making the under-screen camera unable to work normally.

Therefore, in conventional display devices, light transmittance is relatively low, leading to poor performance of an under-screen camera.

SUMMARY

Embodiments of the present disclosure provide an OLED display panel and an OLED display device to alleviate a following issue: in conventional display devices, light transmittance is relatively low, leading to poor performance of an under-screen camera.

To solve the above issue, technical solutions provided by the present disclosure are as follows.

An embodiment of the present disclosure provides an organic light-emitting diode (OLED) display panel, including a first display area and a second display area corresponding to a position where an electronic element is disposed, wherein the OLED display panel comprises:
  a substrate;
  a driving circuit layer disposed on a side of the substrate;
  a light-emitting layer disposed on a side of the driving circuit layer away from the substrate;
  an optical coupling layer disposed on a side of the light-emitting layer away from the driving circuit layer; and
  an encapsulation layer disposed on a side of the optical coupling layer away from the light-emitting layer;
  wherein in the second display area, the side of the light-emitting layer away from the driving circuit layer is provided with a light transmission enhancement layer.

In some embodiments, the second display area comprises a display area corresponding to a plurality of sub-pixels and a non-display area located between corresponding sub-pixels, and the light transmission enhancement layer is disposed on the non-display area.

In some embodiments, the light transmission enhancement layer is disposed between the light-emitting layer and the optical coupling layer.

In some embodiments, a thickness of the light transmission enhancement layer ranges from 60 nm to 160 nm.

In some embodiments, a refractive index of the light transmission enhancement layer ranges from 1.3 to 2.0.

In some embodiments, the light transmission enhancement layer is disposed on a side of the encapsulation layer away from the optical coupling layer.

In some embodiments, in the display area and the first display area, the OLED display panel further comprises a filling layer disposed on the light transmission enhancement layer, and the filling layer is configured to fill a plurality of voids of the light transmission enhancement layer.

In some embodiments, a material of the light transmission enhancement layer comprises at least one of an epoxy-based organic material or an acrylic-based organic material.

In some embodiments, the light transmission enhancement layer is disposed in the first display area.

Moreover, an embodiment of the present disclosure provides an organic light-emitting diode (OLED) display device, comprising:
  an OLED display panel, wherein the OLED display panel includes a first display area and a second display area corresponding to a position where an electronic element is disposed, the OLED display panel includes a substrate, a driving circuit layer, a light-emitting layer, an optical coupling layer, and an encapsulation layer, the driving circuit layer is disposed on a side of the substrate, the light-emitting layer is disposed on a side of the driving circuit layer away from the substrate, the optical coupling layer is disposed on a side of the light-emitting layer away from the driving circuit layer, and the encapsulation layer is disposed on a side of the optical coupling layer away from the light-emitting layer, wherein in the second display area, the side of the light-emitting layer away from the driving circuit layer is provided with a light transmission enhancement layer; and
  an electronic element disposed in the second display area.

In some embodiments, the electronic element comprises a camera.

In some embodiments, the second display area comprises a display area corresponding to a plurality of sub-pixels and a non-display area between corresponding sub-pixels, and the light transmission enhancement layer is disposed on the non-display area.

In some embodiments, the light transmission enhancement layer is disposed between the light-emitting layer and the optical coupling layer.

In some embodiments, a thickness of the light transmission enhancement layer ranges from 60 nm to 160 nm.

In some embodiments, a refractive index of the light transmission enhancement layer ranges from 1.3 to 2.0.

In some embodiments, a thickness of the light transmission enhancement layer is 155 nm, and the refractive index of the light transmission enhancement layer is 1.5.

In some embodiments, the light transmission enhancement layer is disposed on a side of the encapsulation layer away from the optical coupling layer.

In some embodiments, in the display area and the first display area, the OLED display panel further comprises a filling layer disposed on the light transmission enhancement layer, and the filling layer is configured to fill a plurality of voids of the light transmission enhancement layer.

In some embodiments, a material of the light transmission enhancement layer comprises at least one of an epoxy-based organic material or an acrylic-based organic material.

In some embodiments, the light transmission enhancement layer is disposed in the first display area.

Regarding the beneficial effects: embodiments of the present disclosure provide an OLED display panel and an OLED display device. The OLED display panel includes a first display area and a second display area corresponding to a position where an electronic element is disposed. The OLED display panel comprises a substrate, a driving circuit layer, a light-emitting layer, an optical coupling layer, and an encapsulation layer. The driving circuit layer is disposed on a side of the substrate. The light-emitting layer is disposed on a side of the driving circuit layer away from the substrate. The optical coupling layer is disposed on a side of the light-emitting layer away from the driving circuit layer. The encapsulation layer is disposed on the optical coupling layer away from the light-emitting layer. In the second display area, a light transmission enhancement is disposed on the side of the light-emitting layer away from the driving circuit layer. In the present disclosure, by disposing the light transmission enhancement on the light-emitting layer, a resonant microcavity of the OLED display panel is changed. Therefore, light transmittance of the OLED display panel is improved, and an imaging effect of an under-screen camera is improved.

DESCRIPTION OF DRAWINGS

Technical solutions and beneficial effects of the present disclosure are illustrated below in detail in conjunction with drawings and specific embodiments.

DETAILED DESCRIPTION

Hereinafter a preferred embodiment of the present disclosure will be described with reference to the accompanying drawings to exemplify the embodiments of the present disclosure can be implemented, which can fully describe the technical contents of the present disclosure to make the technical content of the present disclosure clearer and easy to understand.

However, the described embodiments are only some of the embodiments of the present disclosure, but not all of the embodiments. All other embodiments obtained by those skilled in the art based on the embodiments of the present disclosure without creative efforts are within the scope of the present disclosure.

Embodiments, which are based on the embodiments of the present disclosure, obtained by those skilled in the art without making any inventive efforts are within the scope of protection defined by the present disclosure.

Embodiments of the present disclosure provide an OLED display panel and an OLED display device to alleviate a following issue: in conventional display devices, light transmittance is relatively low, leading to poor performance of an under-screen camera.

Figure 1:
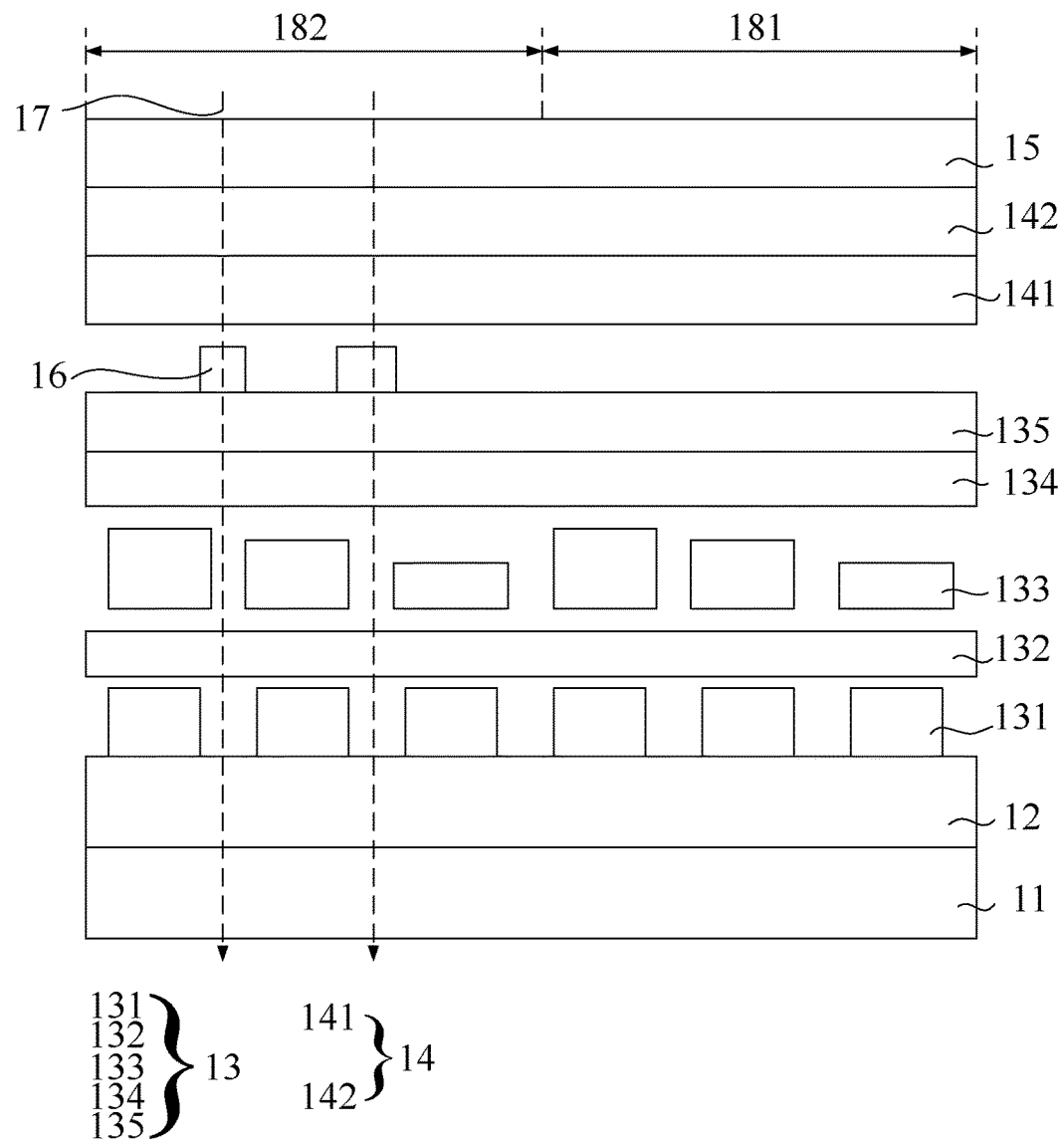
FIG. 1 is a first schematic view showing an OLED display panel provided by an embodiment of the present disclosure.

As shown in FIG. 1, an embodiment of the present disclosure provides an OLED display panel. The OLED display panel includes a first display area 181 and a second display area 182 corresponding to a position where an electronic element is disposed. The OLED display panel includes:

a substrate 11;
a driving circuit layer 12 disposed on a side of the substrate 11;
a light-emitting layer 13 disposed on a side of the driving circuit layer 12 away from the substrate 11;
an optical coupling layer 14 disposed on a side of the light-emitting layer 13 away from the driving circuit layer 12; and
an encapsulation layer 15 disposed on a side of the optical coupling layer 14 away from the light-emitting layer 13;
wherein in the second display area 182, a light transmission enhancement layer 16 is disposed on the side of the light-emitting layer 13 away from the driving circuit layer 12.

In the OLED display panel provided by the present embodiment, the light transmission enhancement is disposed on the light-emitting layer. As a result, a resonant microcavity of the OLED display panel is changed. Therefore, light transmittance of the OLED display panel is improved, and an imaging effect of an under-screen camera is improved.

In the present embodiment, the OLED display panel is described in detail with the position where the electronic element is disposed being the display area, but the present disclosure is not limited thereto. The position where the electronic element is disposed may also be a non-display area, thereby improving light transmittance.

A light-acceptance effect of the area where the electronic element is disposed is poor. When the light transmission enhancement layer is disposed, light transmittance of other areas should not be affected. In one embodiment, as shown in FIG. 1, the second display area 182 includes a display area corresponding to a plurality of sub-pixels and a non-display area between corresponding sub-pixels. The light transmission enhancement layer 16 is disposed on the non-display area. Specifically, the non-display area between the corresponding sub-pixels includes a light-acceptance area corresponding to a light-acceptance position of the electronic element. By disposing the light transmission enhancement layer in the light-acceptance position of the electronic element, a resonant microcavity of the OLED display panel can be adjusted by the light transmission enhancement layer. As a result, light transmittance of a light-acceptance area of the OLED display panel corresponding to the light-acceptance position of the electronic element is improved. Therefore, a light transmittance of the light-acceptance area of the OLED display panel corresponding to the light-acceptance position of the electronic element is improved. The electronic element is prevented from being unable to work normally due to a poor light-acceptance effect.

As shown in FIG. 1, the light transmission enhancement layer 16 is disposed in the non-display area to allow more light 17 to pass through the non-display area.

In the present embodiment, the non-display area between corresponding sub-pixels includes the light-acceptance area corresponding to the light-acceptance position of the electronic element. For example, in the electronic element of the OLED display panel, a light-acceptance part of the electronic element corresponds to an interval between sub-pixels. The non-display area corresponding to the interval between the sub-pixels includes an area corresponding to the light-acceptance part of the electronic element. A position where the light transmission enhancement layer is disposed is determined according to the light-acceptance position of the electronic element. The above design aims to enhance light transmittance of the light-acceptance position of the electronic element. The light-acceptance position of the electronic element extends to an area corresponding to the sub-pixels. The light transmission enhancement layer may be disposed in the area corresponding to the sub-pixels.

In the present embodiment, a resonant microcavity is formed of all layers of the OLED display panel. That is, the resonant microcavity includes all layers from the substrate to the encapsulation layer. In the present embodiment, the resonant microcavity can be adjusted by the light transmission enhancement layer, thereby improving light transmittance of the OLED display panel.

In one embodiment, as shown in FIG. 1, the light transmission enhancement layer 16 is disposed between the light-emitting layer 13 and the optical coupling layer 14. By disposing the light transmission enhancement layer between the light-emitting layer and the optical coupling layer, the resonant microcavity of the OLED display panel can be adjusted by the light transmission enhancement layer, thereby increasing light transmittance of the OLED display panel and improving the light-acceptance effect of the electronic element.

In one embodiment, a thickness of the light transmission enhancement layer ranges from 60 nm to 160 nm. The OLED display panel is tested by adjusting a thickness of the light transmission enhancement layer. When a thickness of the light transmission enhancement layer ranges from 60 nm to 160 nm, light transmittance of the OLED display panel is relatively good. Therefore, a thickness of the light transmission enhancement layer is set to be 60 nm to 160 nm.

In one embodiment, a refractive index of the light transmission enhancement layer ranges from 1.3 to 2.0. The OLED display panel is tested by adjusting a refractive index of the light transmission enhancement layer. When a refractive index of the light transmission enhancement layer ranges from 1.3 to 2.0, transmittance of the OLED display panel is relatively good. Therefore, a refractive index of the light transmission enhancement layer is set to be 1.3 to 2.0.

Figure 2:
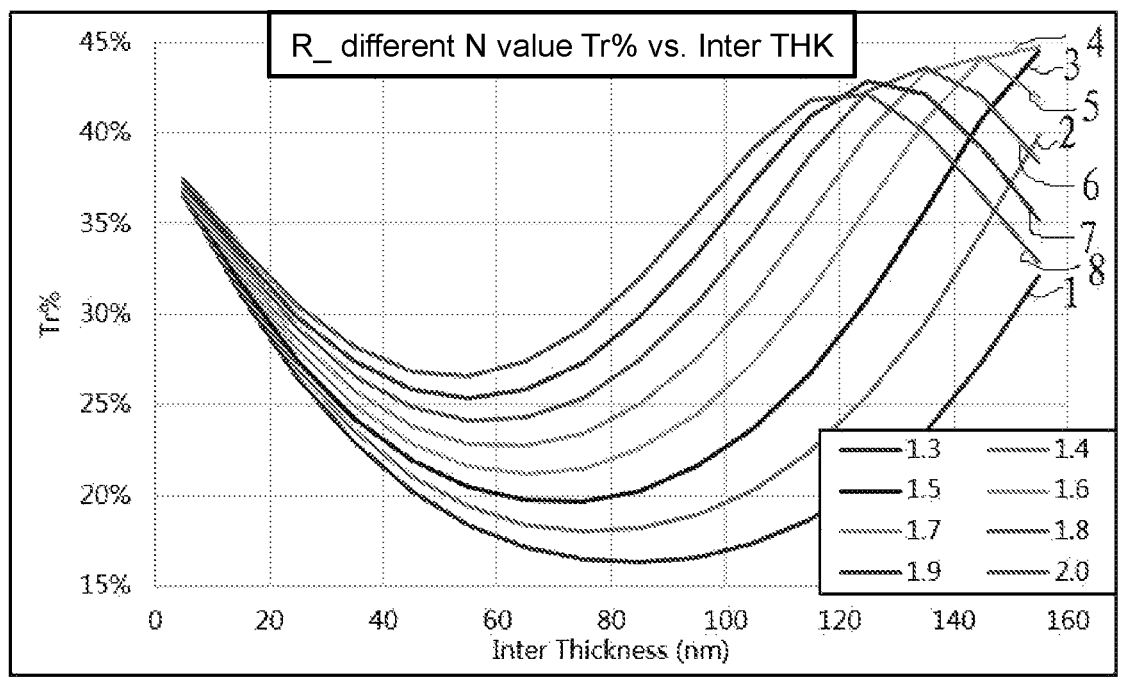
FIG. 2 is a curve chart showing changes in red light transmittance of the OLED display panel in FIG. 1 under light transmission enhancement layers of different thicknesses and different refractive indexes.
Figure 3:
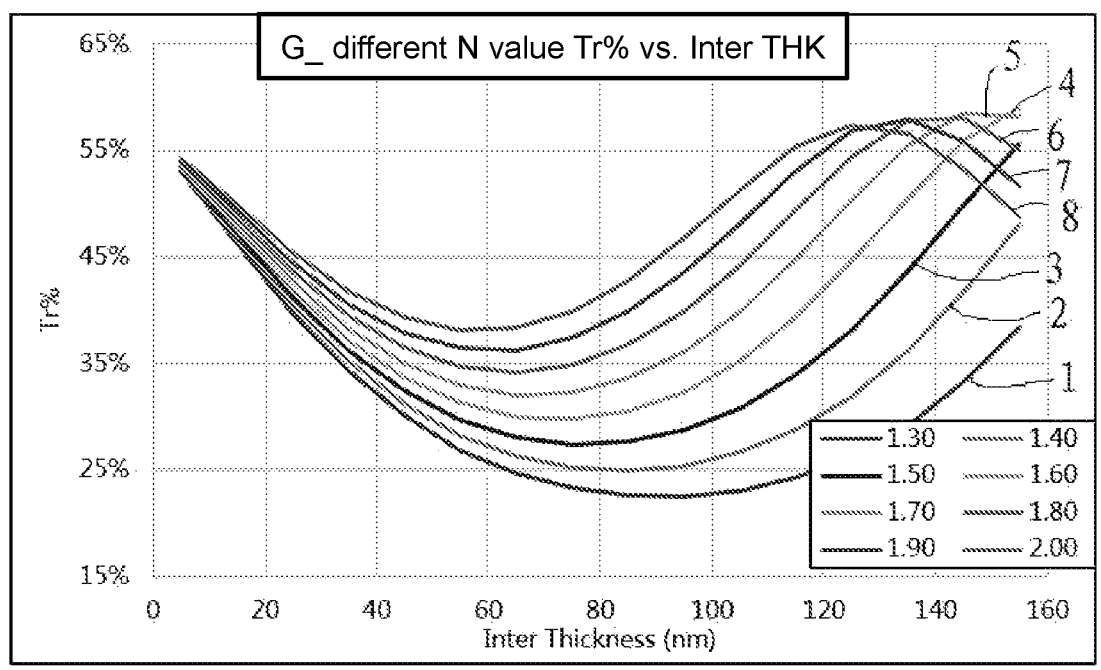
FIG. 3 is a curve chart showing changes in green light transmittance of the OLED display panel in FIG. 1 under light transmission enhancement layers having different thicknesses and different refractive indexes.
Figure 4:
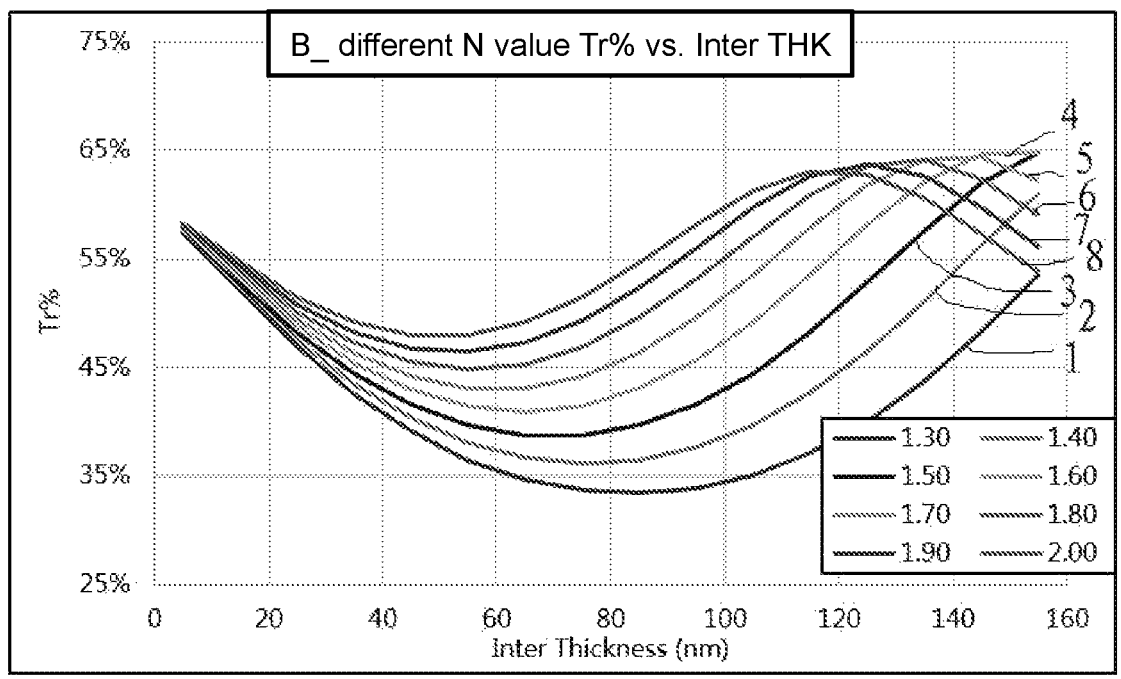
FIG. 4 is a curve chart showing changes in blue light transmittance of the OLED display panel in FIG. 1 under light transmission enhancement layers having different thicknesses and different refractive indexes.

In one embodiment, taking the OLED display panel as shown in FIG. 1 as an example, a thickness and a refractive index of the light transmission enhancement layer are changed to obtain transmittance of light of different colors emitted from the OLED display panel, as shown in FIGS. 2 to 4. FIG. 2 is a curve chart showing changes in red light transmittance of the OLED display panel under different thicknesses and different refractive indexes of the light transmission enhancement layer. FIG. 3 is a curve chart showing changes in green light transmittance of the OLED display panel under different thicknesses and different refractive indexes of the light transmission enhancement layer. FIG. 4 is a curve chart showing changes in blue light transmittance of the OLED display under different thickness and different refractive indexes of the light transmission enhancement layer.

As shown in FIG. 2, a horizontal axis denotes a thickness (inter thickness (nm)) of the light transmission enhancement layer, and a vertical axis denotes red light transmittance (Tr %) of the OLED display panel. R-different N value Tr % vs. Inter THK is a curve of red light transmittance under different thicknesses and different refractive indexes. Wherein, curve 1 shows a relationship between the thickness of the light transmission enhancement layer and the red light transmittance of the OLED display panel when the refractive index of the light transmission enhancement layer is 1.3. Curve 2 shows a relationship between the thickness of the light transmission enhancement layer and the red light transmittance of the OLED display panel when the refractive index of the light transmission enhancement layer is 1.4. Curve 3 shows a relationship between the thickness of the light transmission enhancement layer and the red light transmittance of the OLED display panel when the refractive index of the light transmission enhancement layer is 1.5. Curve 4 shows a relationship between the thickness of the light transmission enhancement layer and the red light transmittance of the OLED display panel when the refractive index of the light transmission enhancement layer is 1.6. Curve 5 shows a relationship between the thickness of the light transmission enhancement layer and the red light transmittance of the OLED display panel when the refractive index of the light transmission enhancement layer is 1.7. Curve 6 shows a relationship between the thickness of the light transmission enhancement layer and the red light transmittance of the OLED display panel when the refractive index of the light transmission enhancement layer is 1.8. Curve 7 shows a relationship between the thickness of the light transmission enhancement layer and the red light transmittance of the OLED display panel when the refractive index of the light transmission enhancement layer is 1.9. Curve 8 shows a relationship between the thickness of the light transmission enhancement layer and the red light transmittance of the OLED display panel when the refractive index of the light transmission enhancement layer is 2.0.

As shown in FIG. 3, a horizontal axis denotes a thickness (inter thickness (nm)) of the light transmission enhancement layer, and a vertical axis denotes green light transmittance (Tr %) of the OLED display panel. G-different N value Tr % vs. Inter THK is a curve of green light transmittance under different thicknesses and different refractive indexes. Wherein, curve 1 shows a relationship between the thickness of the light transmission enhancement layer and the green light transmittance of the OLED display panel when the refractive index of the light transmission enhancement layer is 1.3. Curve 2 shows a relationship between the thickness of the light transmission enhancement layer and the green light transmittance of the OLED display panel when the refractive index of the light transmission enhancement layer is 1.4. Curve 3 shows a relationship between the thickness of the light transmission enhancement layer and the green light transmittance of the OLED display panel when the refractive index of the light transmission enhancement layer is 1.5. Curve 4 shows a relationship between the thickness of the light transmission enhancement layer and the green light transmittance of the OLED display panel when the refractive index of the light transmission enhancement layer is 1.6. Curve 5 shows a relationship between the thickness of the light transmission enhancement layer and the green light transmittance of the OLED display panel when the refractive index of the light transmission enhancement layer is 1.7. Curve 6 shows a relationship between the thickness of the light transmission enhancement layer and the green light transmittance of the OLED display panel when the refractive index of the light transmission enhancement layer is 1.8. Curve 7 shows a relationship between the thickness of the light transmission enhancement layer and the green light transmittance of the OLED display panel when the refractive index of the light transmission enhancement layer is 1.9. Curve 8 shows a relationship between the thickness of the light transmission enhancement layer and the green light transmittance of the OLED display panel when the refractive index of the light transmission enhancement layer is 2.0.

As shown in FIG. 4, a horizontal axis denotes a thickness (inter thickness (nm)) of the light transmission enhancement layer, and a vertical axis denotes blue light transmittance (Tr %) of the OLED display panel. B-different N value Tr % vs. Inter THK is a curve of blue light transmittance under different thicknesses and different refractive indexes. Wherein, curve 1 shows a relationship between the thickness of the light transmission enhancement layer and the blue light transmittance of the OLED display panel when the refractive index of the light transmission enhancement layer is 1.3. Curve 2 shows a relationship between the thickness of the light transmission enhancement layer and the blue light transmittance of the OLED display panel when the refractive index of the light transmission enhancement layer is 1.4. Curve 3 shows a relationship between the thickness of the light transmission enhancement layer and the blue light transmittance of the OLED display panel when the refractive index of the light transmission enhancement layer is 1.5. Curve 4 shows a relationship between the thickness of the light transmission enhancement layer and the blue light transmittance of the OLED display panel when the refractive index of the light transmission enhancement layer is 1.6. Curve 5 shows a relationship between the thickness of the light transmission enhancement layer and the blue light transmittance of the OLED display panel when the refractive index of the light transmission enhancement layer is 1.7. Curve 6 shows a relationship between the thickness of the light transmission enhancement layer and the blue light transmittance of the OLED display panel when the refractive index of the light transmission enhancement layer is 1.8. Curve 7 shows a relationship between the thickness of the light transmission enhancement layer and the blue light transmittance of the OLED display panel when the refractive index of the light transmission enhancement layer is 1.9. Curve 8 shows a relationship between the thickness of the light transmission enhancement layer and the blue light transmittance of the OLED display panel when the refractive index of the light transmission enhancement layer is 2.0.

According to FIGS. 2 to 4 as well as a testing result of an OLED display panel without the light transmission enhancement layer, Table 1 can be obtained.

TABLE 1

A comparison table showing light transmittance of an OLED display panel with/without a light transmission enhancement layer

| color of light | the OLED display panel without a light transmission enhancement layer 550 nm light transmittance (%) | the OLED display panel with a light transmission enhancement layer | | |
|---|---|---|---|---|
| | | 550 nm light transmittance (%) | a thickness of the light transmission enhancement layer (nm) | a refractive index of the light transmission enhancement layer (nm) |
| red | 39.29 | 44.48 | 155 | 1.5 |
| green | 55.97 | 55.62 | 155 | 1.5 |
| blue | 59.89 | 64.78 | 155 | 1.5 |

According to FIGS. 2 to 4 and the Table 1, when the thickness of the light transmission enhancement layer is 155 nm and the refractive index of the light transmission enhancement layer is 1.5, 550 nm red light transmittance of the OLED display panel provided by the present disclosure is increased by about 13.2%. The green light transmittance basically remains unchanged. The blue light transmittance is increased by about 8.2%. The white light transmittance of the OLED display panel is theoretically increased by about 7%.

In an embodiment, the thickness of the light transmission enhancement layer is 155 nm, and the refractive index of the light transmission enhancement layer is 1.5. According to the about data, when the thickness of the light transmission enhancement layer is 155 nm and the refractive index of the light transmission enhancement layer is 1.5 nm, the light transmittance of the OLED display panel can be improved.

In one embodiment, the light transmission enhancement layer is disposed between the optical coupling layer and the encapsulation layer. By disposing the light transmission enhancement layer between the optical coupling layer and the encapsulation layer, a resonant microcavity of the OLED display panel is changed. Therefore, light transmittance of the OLED display panel is improved, and light-acceptance effect of the electronic element is improved.

In one embodiment, as shown in FIG. 1, the optical coupling layer 14 includes a cover layer 141 and a lithium fluoride layer 142, and the light transmission enhancement layer is disposed between the cover layer and the lithium fluoride layer. By disposing the light transmission enhancement layer between the cover layer and the lithium fluoride layer, a resonant microcavity of the OLED display panel is changed. Therefore, light transmittance of the OLED display panel is improved, and light-acceptance effect of the electronic element is improved.

Figure 5:
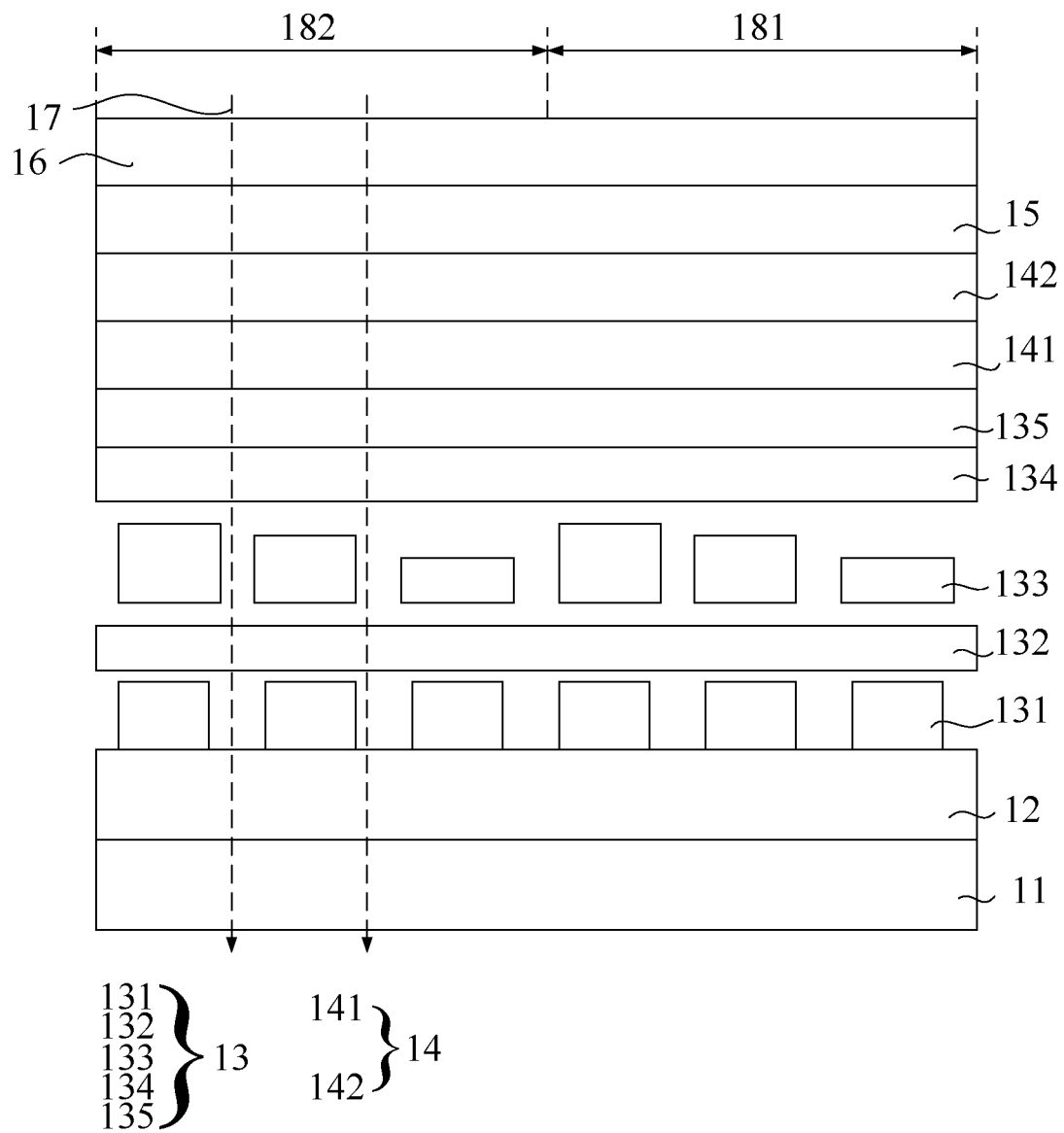
FIG. 5 is a second schematic diagram of an OLED display panel provided by an embodiment of the present disclosure.
Figure 6:
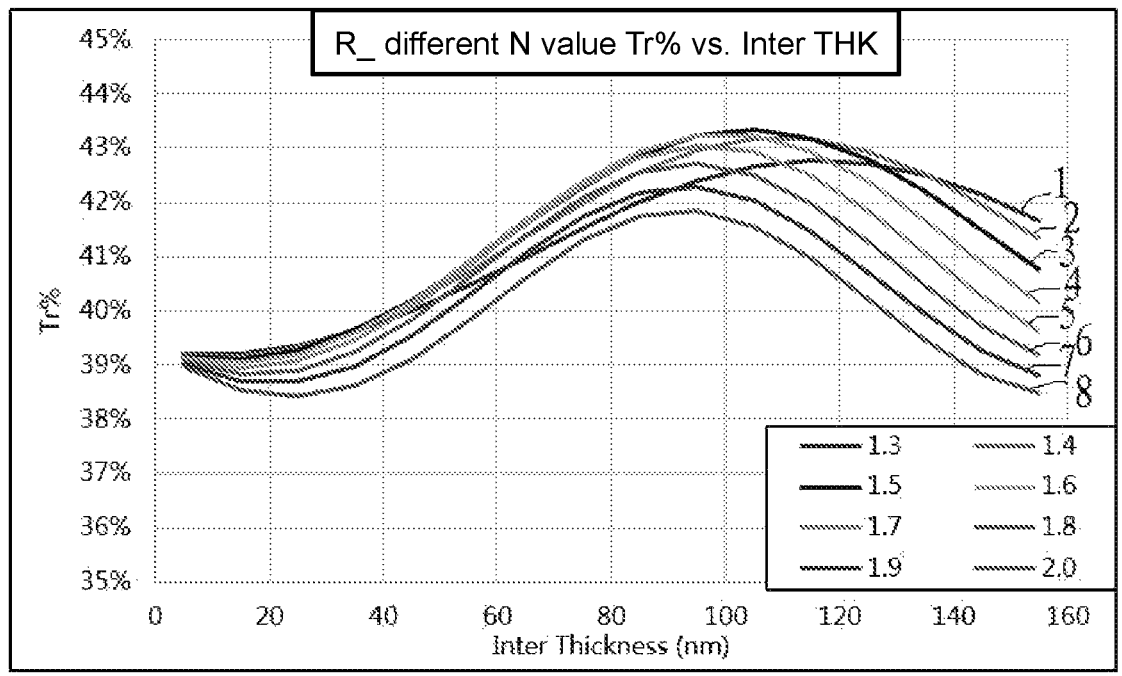
FIG. 6 is a curve chart showing changes in red light transmittance of the OLED display panel in FIG. 5 under light transmission enhancement layers having different thicknesses and different refractive indexes.
Figure 7:
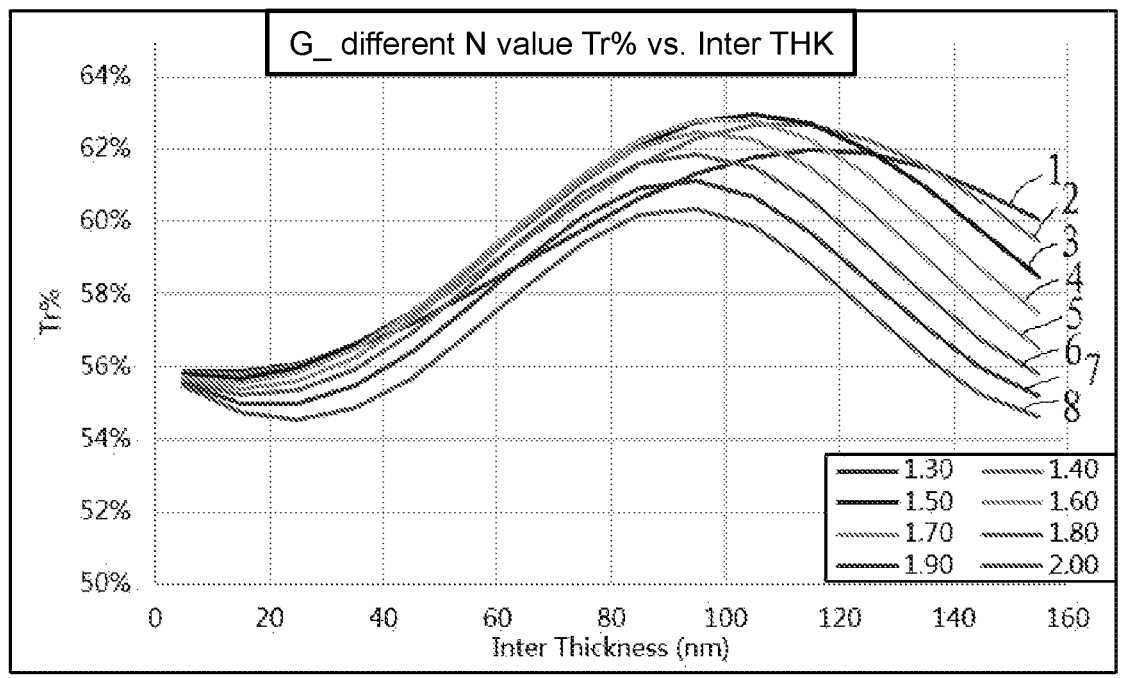
FIG. 7 is a curve chart showing changes in green light transmittance of the OLED display panel in FIG. 5 under light transmission enhancement layers having different thicknesses and different refractive indexes.
Figure 8:
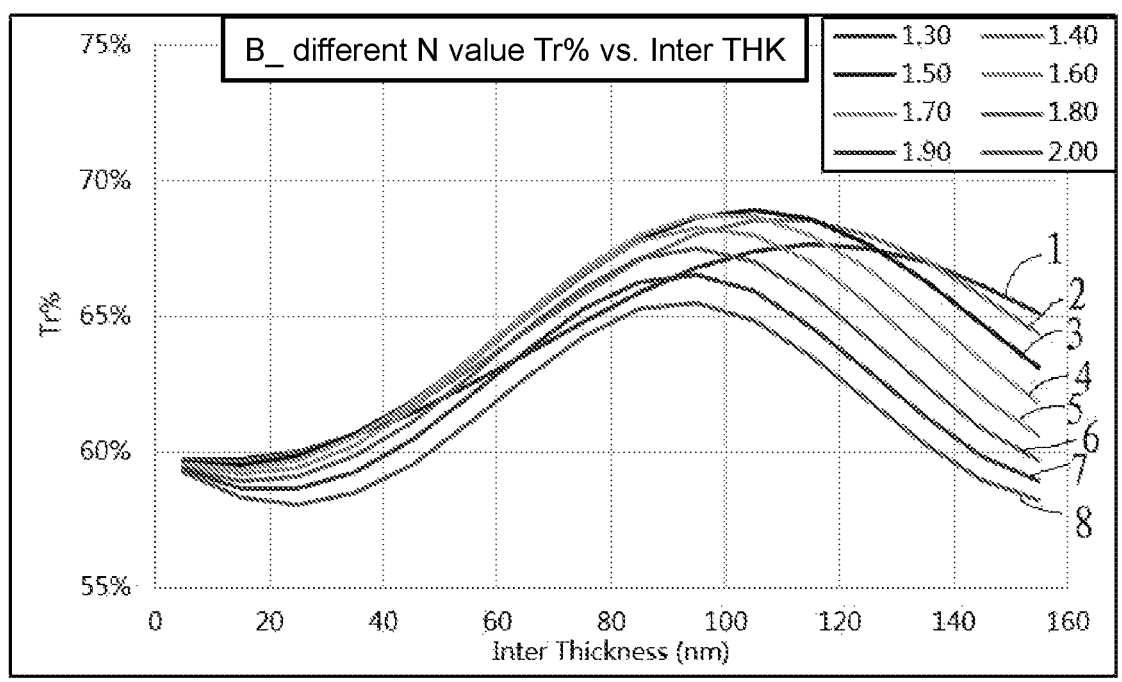
FIG. 8 is a curve chart showing changes in blue light transmittance of the OLED display panel in FIG. 5 under light transmission enhancement layers of different thicknesses and different refractive indexes.

In an embodiment, taking the OLED display panel shown in FIG. 5 as an example, a thickness and a refractive index of the light transmission enhancement layer are changed. Transmittance of light of different colors of the OLED display panel as shown in FIGS. 6 to 8 are obtained. FIG. 6 is a curve showing changes in red light transmittance of the OLED display panel under different thicknesses and different refractive indexes of the light transmission enhancement layer. FIG. 7 is a curve showing green light transmittance of the OLED display panel under different thicknesses and different refractive indexes of the light transmission enhancement layer. FIG. 8 is a curve showing change in green light transmittance of the OLED display panel under different thicknesses and different refractive indexes of the light transmission enhancement layer.

As shown in FIG. 6, a horizontal axis denotes a thickness (inter thickness (nm)) of the light transmission enhancement layer, and a vertical axis denotes red light transmittance (Tr %) of the OLED display panel. R-different N value Tr % vs. Inter THK is a curve of red light transmittance under different thicknesses and different refractive indexes. Wherein, a curve 1 shows a relationship between the thickness of the light transmission enhancement layer and the red light transmittance of the OLED display panel when the refractive index of the light transmission enhancement layer is 1.3. A curve 2 shows a relationship between the thickness of the light transmission enhancement layer and the red light transmittance of the OLED display panel when the refractive index of the light transmission enhancement layer is 1.4. A curve 3 shows a relationship between the thickness of the light transmission enhancement layer and the red light transmittance of the OLED display panel when the refractive index of the light transmission enhancement layer is 1.5. A curve 4 shows a relationship between the thickness of the light transmission enhancement layer and the red light transmittance of the OLED display panel when the refractive index of the light transmission enhancement layer is 1.6. A curve 5 shows a relationship between the thickness of the light transmission enhancement layer and the red light transmittance of the OLED display panel when the refractive index of the light transmission enhancement layer is 1.7. A curve 6 shows a relationship between the thickness of the light transmission enhancement layer and the red light transmittance of the OLED display panel when the refractive index of the light transmission enhancement layer is 1.8. A curve 7 shows a relationship between the thickness of the light transmission enhancement layer and the red light transmittance of the OLED display panel when the refractive index of the light transmission enhancement layer is 1.9. A curve 8 shows a relationship between the thickness of the light transmission enhancement layer and the red light transmittance of the OLED display panel when the refractive index of the light transmission enhancement layer is 2.0.

As shown in FIG. 7, a horizontal axis denotes a thickness (inter thickness (nm)) of the light transmission enhancement layer, and a vertical axis denotes green light transmittance (Tr %) of the OLED display panel. G-different N value Tr % vs. Inter THK is a curve of green light transmittance under different thicknesses and different refractive indexes. Wherein, a curve 1 shows a relationship between the thickness of the light transmission enhancement layer and the green light transmittance of the OLED display panel when the refractive index of the light transmission enhancement layer is 1.3. A curve 2 shows a relationship between the thickness of the light transmission enhancement layer and the green light transmittance of the OLED display panel when the refractive index of the light transmission enhancement layer is 1.4. A curve 3 shows a relationship between the thickness of the light transmission enhancement layer and the green light transmittance of the OLED display panel when the refractive index of the light transmission enhancement layer is 1.5. A curve 4 shows a relationship between the thickness of the light transmission enhancement layer and the green light transmittance of the OLED display panel when the refractive index of the light transmission enhancement layer is 1.6. A curve 5 shows a relationship between the thickness of the light transmission enhancement layer and the green light transmittance of the OLED display panel when the refractive index of the light transmission enhancement layer is 1.7. A curve 6 shows a relationship between the thickness of the light transmission enhancement layer and the green light transmittance of the OLED display panel when the refractive index of the light transmission enhancement layer is 1.8. A curve 7 shows a relationship between the thickness of the light transmission enhancement layer and the green light transmittance of the OLED display panel when the refractive index of the light transmission enhancement layer is 1.9. A curve 8 shows a relationship between the thickness of the light transmission enhancement layer and the green light transmittance of the OLED display panel when the refractive index of the light transmission enhancement layer is 2.0.

As shown in FIG. 8, a horizontal axis denotes a thickness (inter thickness (nm)) of the light transmission enhancement layer, and a vertical axis denotes blue light transmittance (Tr %) of the OLED display panel. B-different N value Tr % vs. Inter THK is a curve of blue light transmittance under different thicknesses and different refractive indexes. Wherein, a curve 1 shows a relationship between the thickness of the light transmission enhancement layer and the blue light transmittance of the OLED display panel when the refractive index of the light transmission enhancement layer is 1.3. A curve 2 shows a relationship between the thickness of the light transmission enhancement layer and the blue light transmittance of the OLED display panel when the refractive index of the light transmission enhancement layer is 1.4. A curve 3 shows a relationship between the thickness of the light transmission enhancement layer and the blue light transmittance of the OLED display panel when the refractive index of the light transmission enhancement layer is 1.5. A curve 4 shows a relationship between the thickness of the light transmission enhancement layer and the blue light transmittance of the OLED display panel when the refractive index of the light transmission enhancement layer is 1.6. A curve 5 shows a relationship between the thickness of the light transmission enhancement layer and the blue light transmittance of the OLED display panel when the refractive index of the light transmission enhancement layer is 1.7. A curve 6 shows a relationship between the thickness of the light transmission enhancement layer and the blue light transmittance of the OLED display panel when the refractive index of the light transmission enhancement layer is 1.8. A curve 7 shows a relationship between the thickness of the light transmission enhancement layer and the blue light transmittance of the OLED display panel when the refractive index of the light transmission enhancement layer is 1.9. A curve 8 shows a relationship between the thickness of the light transmission enhancement layer and the blue light transmittance of the OLED display panel when the refractive index of the light transmission enhancement layer is 2.0.

According to FIGS. 6 to 8 as well as a testing result of an OLED display panel without the light transmission enhancement layer, Table 2 can be obtained.

TABLE 2

A comparison table showing light transmittance of an OLED display panel with/without a light transmission enhancement layer

| color of light | the OLED display panel without a light transmission enhancement layer 550 nm light transmittance (%) | the OLED display panel with a light transmission enhancement layer | | |
|---|---|---|---|---|
| | | 550 nm light transmittance (%) | a thickness of the light transmission enhancement layer (nm) | a refractive index of the light transmission enhancement layer (nm) |
| red | 39.29 | 43.34 | 105 | 1.5 |
| green | 55.97 | 62.97 | 105 | 1.5 |
| blue | 59.89 | 68.94 | 105 | 1.5 |

As shown in FIGS. 6 to 8 and Table 2, when the thickness of the light-transmitting enhancement layer is 105 nm and the refractive index of the light-transmitting reinforcing layer is 1.5, transmittance of 550 nm red light emitted from the OLED display panel provided by the present disclosure is increased by approximately 10.3%, transmittance of 550 nm green light is increased by approximately 12.5%, transmittance of blue light is increased by approximately 15.1%, and transmittance of white light emitted from the OLED display panel is theoretically increased by approximately 13%.

Disposing the light transmission enhancement layer on some areas results in uneven surface of layers of the OLED display panel. In the display area and the first display area, the OLED display panel further comprises a filling layer, and the filling layer is disposed on the light transmission enhancement layer. The filling layer is configured to fill a plurality of voids of the light transmission enhancement layer. When the light transmission enhancement layer is disposed, voids are generated in areas not provided with the light transmission enhancement layer, tilting layers in subsequent processes. Therefore, the filling layer is disposed on the light transmission enhancement layer to fill voids of the light transmission enhancement layer, which is beneficial for manufacturing subsequent layers.

In one embodiment, a material of the light transmission enhancement layer includes at least one of an epoxy-based organic material or an acrylic-based organic material. A material of the light transmission enhancement layer includes an epoxy-based organic material or an acrylic organic material. Therefore, light transmittance of the OLED display panel can be increased by adjusting a resonant microcavity, and light transmittance of the light transmission enhancement layer can be increased as well.

In the above-mentioned embodiment, areas where the light transmission enhancement layer is disposed are described in detail. In the above-mentioned embodiment, the light transmission enhancement layer is note disposed on an entire surface, thereby preventing luminescent effect of other areas from being affected by the light transmission enhancement layer. However, in the present embodiment, to increase light transmittance of the display area, the light transmittance enhancement layer may also be disposed in the display area.

In one embodiment, the second display area includes a display area corresponding to the sub-pixels and a non-display area between corresponding sub-pixels, and the light transmission enhancement layer is disposed in the display area and the non-display area. When disposing the light transmission enhancement layer, the light transmission enhancement layer can also be disposed in the entire second display area, so that the light transmission enhancement layer increases the light transmittance of the OLED display panel. Therefore, more external light and more light emitted from the OLED display panel can pass through the OLED display panel. As a result, light-acceptance of the electronic element can be improved, and light transmittance of the OLED display panel can be increased.

In one embodiment, the light transmission enhancement layer is disposed in the first display area. When the light transmission enhancement layer is provided, the light transmission enhancement layer can be arranged on the entire surface, thereby improving light-acceptance effect of the electronic element and the light transmittance of the OLED display panel. Furthermore, since the light transmission enhancement layer is disposed on the entire layer, it is not necessary to provide a filling layer. Therefore, processes are reduced.

In one embodiment, as shown in FIG. 1, the light-emitting layer includes a pixel electrode layer 131, a hole transport layer 132, a light-emitting material layer 133, an electron transport layer 134, and a common electrode layer 135. In the light-emitting material layer 133, a size of a red material, a size of a green material, and a size of a blue material may be different. However, the present embodiment is not limited thereto. Designs of the light-emitting material layer may be diverse.

In one embodiment, a pixel-defining layer is disposed between the sub-pixels, and the pixel-defining layer is configured to define a pixel area.

Figure 9:
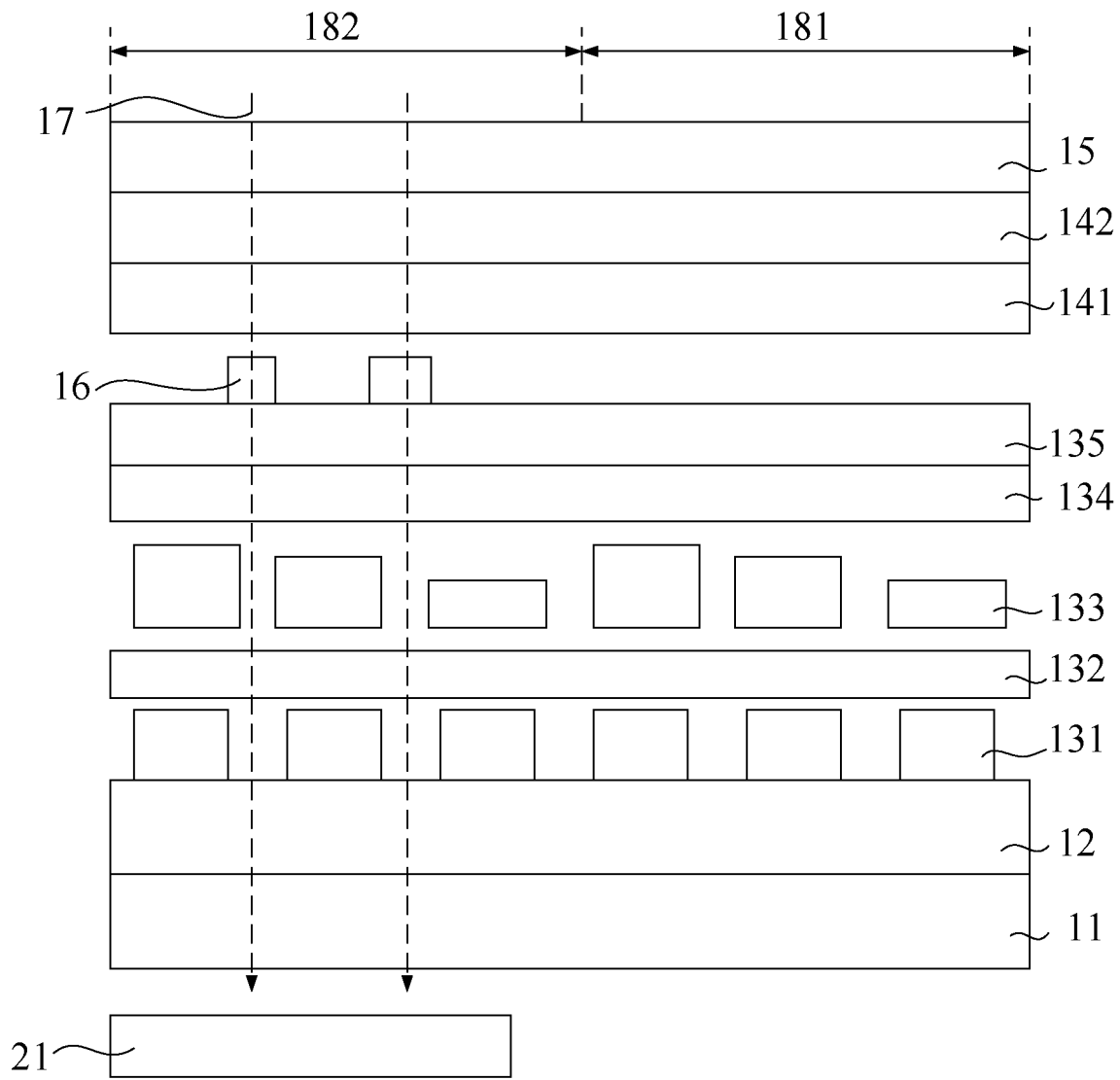
FIG. 9 is a schematic view showing an OLED display device provided by an embodiment of the disclosure.

Meanwhile, as shown in FIG. 9, an embodiment of the present disclosure provides an OLED display device, including:

an OLED display panel, including a first display area 181 and a second display area 182 corresponding to a position wherein an electronic element is disposed. The OLED display panel includes a substrate 11, a driving circuit layer 12, a light-emitting layer 13, an optical coupling layer 14, and an encapsulation layer 15. The driving circuit layer 12 is disposed on a side of the substrate 11. The light-emitting layer 13 is disposed on a side of the driving circuit layer 12 away from the substrate 11. The optical coupling layer 14 is disposed on a side the light-emitting layer 13 away from the driving circuit layer 12. The encapsulation layer 15 is disposed on a side of the optical coupling layer 14 away from the light-emitting layer 13. Wherein, in the second display area 182, a light transmission enhancement layer 16 is disposed on the side of the light-emitting layer 13 away from the driving circuit layer 12.

The OLED display device includes an electronic element 21 disposed in the second display area 182.

The present embodiment provides the OLED display device, the OLED display device includes the OLED display panel and the electronic element. The OLED display panel is provided with a light transmission enhancement layer on the light-emitting layer, so that a resonant microcavity of the OLED display panel can be changed by the light transmission enhancement layer. Therefore, light transmittance of the OLED display panel is increased, thereby improving an imaging effect of an under-screen camera.

In an embodiment, the electronic element includes a camera.

In one embodiment, in the OLED display device, the second display area includes a display area corresponding to a plurality of sub-pixels and a non-display area between corresponding sub-pixels, and the light transmission enhancement layer is disposed in the non-display area.

In one embodiment, in the OLED display device, the light transmission enhancement layer is disposed between the light-emitting layer and the optical coupling layer.

In one embodiment, in the OLED display device, a thickness of the light transmission enhancement layer ranges from 60 nm to 160 nm.

In one embodiment, in the OLED display device, a refractive index of the light transmission enhancement layer ranges from 1.3 to 2.0.

In one embodiment, the thickness of the light transmission enhancement layer is 155 nm, and the refractive index of the light transmission enhancement layer is 1.5.

In one embodiment, in the OLED display device, the light transmission enhancement layer is disposed on the side of the encapsulation layer away from the optical coupling layer.

In one embodiment, in the OLED display device, in the display area and the first display area, the OLED display panel further includes a filling layer disposed on the light transmission enhancement layer. The filling layer is configured to fill a plurality of voids of the light transmission enhancement layer.

In one embodiment, in the OLED display device, a material of the light transmission enhancement layer includes at least one of an epoxy-based organic material or an acrylic-based organic material.

In an embodiment, in the OLED display device, the light transmission enhancement layer is disposed in the first display area.

According to the above-mentioned embodiments:

embodiments of the present disclosure provide an OLED display panel and an OLED display device. The OLED display panel includes a first display area and a second display area corresponding to a position where an electronic element is disposed. The OLED display panel comprises a substrate, a driving circuit layer, a light-emitting layer, an optical coupling layer, and an encapsulation layer. The driving circuit layer is disposed on a side of the substrate. The light-emitting layer is disposed on a side of the driving circuit layer away from the substrate. The optical coupling layer is disposed on a side of the light-emitting layer away from the driving circuit layer. The encapsulation layer is disposed on the optical coupling layer away from the light-emitting layer. In the second display area, a light transmission enhancement is disposed on the side of the light-emitting layer away from the driving circuit layer. In the present disclosure, by disposing the light transmission enhancement on the light-emitting layer, a resonant microcavity of the OLED display panel is changed. Therefore, light transmittance of the OLED display panel is improved, and an imaging effect of an under-screen camera is improved.

In the above embodiments, the focus of each embodiment is different, and for a part that is not detailed in an embodiment, reference may be made to related descriptions of other embodiments.

The OLED display panel and the OLED display device have been described in detail with embodiments provided by the present disclosure which illustrates principles and implementations thereof. However, the description of the above embodiments is only for helping to understand the technical solution of the present disclosure and core ideas thereof, and it is understood by those skilled in the art that many changes and modifications to the described embodiment can be carried out without departing from the scope and the spirit of the disclosure that is intended to be limited only by the appended claims.

What is claimed is:

1. An organic light-emitting diode (OLED) display panel, comprising a first display area and a second display area corresponding to a position where an electronic element is disposed, wherein the OLED display panel comprises:
   a substrate;
   a driving circuit layer disposed over the substrate;
   a light-emitting layer disposed over the driving circuit layer;
   an optical coupling layer disposed over the light-emitting layer; and
   an encapsulation layer disposed over the optical coupling layer;
   wherein in the second display area, a light transmission enhancement layer is provided over the light-emitting layer.

2. The OLED display panel of claim 1, wherein the second display area comprises a display area corresponding to a plurality of sub-pixels and a non-display area located between corresponding sub-pixels, and the light transmission enhancement layer is disposed on the non-display area.

3. The OLED display panel of claim 2, wherein the light transmission enhancement layer is disposed between the light-emitting layer and the optical coupling layer.

4. The OLED display panel of claim 3, wherein a thickness of the light transmission enhancement layer ranges from 60 nm to 160 nm.

5. The OLED display panel of claim 3, wherein a refractive index of the light transmission enhancement layer ranges from 1.3 to 2.0.

6. The OLED display panel of claim 2, wherein the light transmission enhancement layer is disposed over the encapsulation layer.

7. The OLED display panel of claim 2, wherein in the display area and the first display area, the OLED display panel further comprises a filling layer disposed on the light transmission enhancement layer, and the filling layer is configured to fill a plurality of voids of the light transmission enhancement layer.

8. The OLED display panel of claim 1, wherein a material of the light transmission enhancement layer comprises at least one of an epoxy-based organic material or an acrylic-based organic material.

9. The OLED display panel of claim 1, wherein the light transmission enhancement layer is disposed in the first display area.

10. An organic light-emitting diode (OLED) display device, comprising:
    an OLED display panel, comprising a first display area and a second display area corresponding to a position where an electronic element is disposed, and comprising a substrate, a driving circuit layer, a light-emitting layer, an optical coupling layer, and an encapsulation layer, wherein the driving circuit layer is disposed over the substrate, the light-emitting layer is disposed over the driving circuit layer, the optical coupling layer is disposed over the light-emitting layer, and the encapsulation layer is disposed over the optical coupling layer, and in the second display area, a light transmission enhancement layer is provided over light-emitting layer; and the electronic element disposed in the second display area.

11. The OLED display device of claim 10, wherein the electronic element comprises a camera.

12. The OLED display device of claim 10, wherein the second display area comprises a display area corresponding to a plurality of sub-pixels and a non-display area between corresponding sub-pixels, and the light transmission enhancement layer is disposed on the non-display area.

13. The OLED display device of claim 12, wherein the light transmission enhancement layer is disposed between the light-emitting layer and the optical coupling layer.

14. The OLED display device of claim 13, wherein a thickness of the light transmission enhancement layer ranges from 60 nm to 160 nm.

15. The OLED display device of claim 13, wherein a refractive index of the light transmission enhancement layer ranges from 1.3 to 2.0.

16. The OLED display device of claim 15, wherein a thickness of the light transmission enhancement layer is 155 nm, and the refractive index of the light transmission enhancement layer is 1.5.

17. The OLED display device of claim 12, wherein the light transmission enhancement layer is disposed over the encapsulation layer.

18. The OLED display device of claim 12, wherein in the display area and the first display area, the OLED display panel further comprises a filling layer disposed on the light transmission enhancement layer, and the filling layer is configured to fill a plurality of voids of the light transmission enhancement layer.

19. The OLED display device of claim 10, wherein a material of the light transmission enhancement layer comprises at least one of an epoxy-based organic material or an acrylic-based organic material.

20. The OLED display device of claim 10, wherein the light transmission enhancement layer is disposed in the first display area.

* * * * *